United States Patent
Yang

(10) Patent No.: US 8,143,672 B2
(45) Date of Patent: Mar. 27, 2012

(54) SEMICONDUCTOR DEVICE INCLUDING A METAL LAYER HAVING A FIRST PATTERN AND A SECOND PATTERN WHICH TOGETHER FORM A WEB STRUCTURE, THEREBY PROVIDING IMPROVED ELECTROSTATIC DISCHARGE PROTECTION

(75) Inventor: Hyang-Ja Yang, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 621 days.

(21) Appl. No.: 11/522,886

(22) Filed: Sep. 18, 2006

(65) Prior Publication Data

US 2007/0215948 A1    Sep. 20, 2007

(30) Foreign Application Priority Data

Mar. 17, 2006    (KR) .................. 10-2006-0024790

(51) Int. Cl.
*H01L 23/62* (2006.01)
*H01L 23/48* (2006.01)

(52) U.S. Cl. .................. 257/355; 257/758; 257/774

(58) Field of Classification Search .......... 257/355–363, 257/758, 774
See application file for complete search history.

(56) References Cited

U.S. PATENT DOCUMENTS

| | | | |
|---|---|---|---|
| 5,514,892 A | 5/1996 | Countryman et al. | |
| 6,388,851 B1 | 5/2002 | Pettersson | |
| 6,717,270 B1 * | 4/2004 | Downey et al. | 257/758 |
| 6,844,631 B2 * | 1/2005 | Yong et al. | 257/786 |
| 6,919,603 B2 | 7/2005 | Brodsky et al. | |
| 2002/0109189 A1 | 8/2002 | Chen et al. | |
| 2002/0153564 A1 | 10/2002 | Shirai | |
| 2003/0218255 A1 * | 11/2003 | Park et al. | 257/758 |
| 2004/0155291 A1 | 8/2004 | Okushima | |
| 2005/0161707 A1 | 7/2005 | Dikken | |

* cited by examiner

*Primary Examiner* — Ori Nadav
(74) *Attorney, Agent, or Firm* — F. Chau & Associates, LLC

(57) ABSTRACT

A semiconductor device includes a diode region having a plurality of protection diodes and a pad region overlapped with an upper part of the diode region. The pad region having a pad installed corresponding to an external connection terminal. The semiconductor device further includes a contact plug unit which connects at least one of a plurality of active regions constituting the diode region and the pad within the diode region.

27 Claims, 15 Drawing Sheets

US 8,143,672 B2

SEMICONDUCTOR DEVICE INCLUDING A METAL LAYER HAVING A FIRST PATTERN AND A SECOND PATTERN WHICH TOGETHER FORM A WEB STRUCTURE, THEREBY PROVIDING IMPROVED ELECTROSTATIC DISCHARGE PROTECTION

CROSS-REFERENCE TO RELATED APPLICATION

This application claims priority from Korean Patent Application No. 10-2006-0024790, filed Mar. 17, 2006, the disclosure of which is hereby incorporated by reference herein in its entirety.

TECHNICAL FIELD

The present disclosure relates to semiconductor integrated circuits, and more particularly, to an electrical connection between pads and electrostatic discharge protection devices in a semiconductor integrated circuit.

BACKGROUND

Semiconductors devices are becoming more highly-integrated and are operating at increasingly higher clock speeds, thereby resulting in higher-performance electronic systems being produced. The above-mentioned higher-performance electronic systems include, for example, portable multimedia players, personal computers or electronic communication devices. Accordingly, manufacturers of integrated circuit chips are seeking to manufacture chip internal circuits according to a reduced critical dimension.

However, static electricity may significantly damage electronic devices, including integrated-circuit chips. As a result, to protect internal circuits from static electricity, protection devices are typically being employed within input or output paths of integrated circuit chips, and various kinds of integrated circuits are being tested through an ESD (Electrostatic Discharge) test before shipment.

For example, U.S. Pat. No. 5,514,892, describes an electrostatic discharge protection device having diodes that are provided in a lower part of a wire bond pad.

Manufacturers have been employing a suicide process using a low electric resistance for producing semiconductor integrated circuits, to obtain higher performance semiconductor devices. However, the above silicide process may result in certain difficulties with regard to electrostatic discharge protection such as, the capacity of parasitic diodes within a chip may be small when using this process. For example, the parasitic diodes may be herein parasitically formed between a source/drain connected to an input/output terminal such as a metal-oxide semiconductor field-effect transistor (MOSFET) and a substrate on which the source/drain are formed or a well. Moreover, the protection diodes have substantially more load from static electricity, and thus the pressure resistance characteristic may be relatively prominent within a limited occupying area. In other words, it may be relatively more difficult to protect the ESD in a semiconductor integrated circuit formed by a silicide process, and thus chip designers have been trying to obtain an improved ESD protection level.

For example, in employing the ESD protection device shown in FIG. 1 within a chip, chip designers have performed various analyses for an ESD failure mechanism using test modes such as shown in FIG. 2 to provide for a situation in which the ESD protection may fail to execute the test for chips.

FIG. 1 illustrates wired protection devices applied to a pad in a conventional semiconductor integrated circuit. FIG. 2 illustrates various electrostatic discharge stress modes in a conventional semiconductor integrated circuit.

In FIG. 2, four modes, a PS (Pin to VSS Positive) mode, an NS (Pin to VSS Negative) mode, a PD (Pin to VDD Positive) mode and an ND (Pin to VDD Negative) mode, indicate the modeling of stress from static electricity. The four modes belong to stresses related to HBM (Human Body Model) or MM (Machine Model), and to a CDM (Changed Device Model). In the PS mode and the PD mode, positive static is input to pins of a chip, and in the NS mode and the ND mode, negative static is input to pins of a chip.

Referring to FIG. 1, an integrated circuit includes an internal circuit 8 connected between a power supply voltage VDD and a ground voltage VSS. In the integrated circuit shown in FIG. 1, a pad 2 such as, for example, a bonding pad is connected to electrostatic discharge protection diodes 4 and 6 through a connection point NO1. Moreover, in FIG. 1, a clamp circuit 7 to limit voltage may be connected between the power supply voltage VDD and the ground voltage VSS, and the pad 2 may be installed corresponding to pins such as, for example, an input pin, output pin or input/output pin.

A p-type diode 4 is an electrostatic discharge protection diode to discharge static electricity to a power supply voltage (VDD) line when a positive static flows to the pad 2 from the power supply voltage VDD. An n-type diode 6 is an electrostatic discharge protection diode to discharge static electricity to a ground voltage (VSS) line when a negative static flows to the pad 2 from the ground voltage VSS. As shown in FIG. 1, when an electrostatic voltage flows to each diode 4, 6 with a level over a turn-on voltage level, each diode 4, 5 is turned on. Thus, current based on an electrostatic voltage is discharged to the power supply voltage VDD and the ground voltage VSS through respective diodes 4 and 6 without flowing into the internal circuit 8, and so the internal circuit of the integrated circuit chip can be protected from static electricity.

The protection diodes of FIG. 1 may be disposed under the pad 2 as shown in FIG. 3 to reduce chip size. FIG. 3 is a schematic sectional view illustrating an example in which a protection device of FIG. 1 is formed on a substrate.

Referring to FIG. 3, on a substrate 50, an n-type well 60 where n-type ions exist, and a p-type well 70 where p-type ions exist, are formed. High-density diffusion regions 62, 64 and 65 formed in the n-type well 60 constitute the p-type diode 4 of FIG. 1, and high-density diffusion regions 72, 74 and 75 of the p-type well 70 constitute the n-type diode 6 of FIG. 1. From among the diffusion regions, regions 62,74 and 75 are the regions diffused after a high density implantation of p-type ions, and regions 72,64 and 65 are the regions diffused after a high density implantation of n-type ions. The diffusion regions 62 and 72 are connected to the connection point NO1 through respective connected lines CP1 and CP2, and the connection point NO1 is electrically connected to a lower port of the pad 2. The regions 64 and 75 are connected, respectively to a line 1 of power supply voltage VDD and a line 3 of ground voltage VSS. The region 65 seems to be distanced from the region 64 by a sectional structure in the drawing, but the regions 65 and 64 are substantially the same diffused region. Likewise, the region 74 is the same diffused region as the region 75.

In forming the ESD protection diodes shown in FIG. 1 on the substrate, layout dependency is significant. Therefore, it may be desirable to form them under the pad 2 as shown in the sectional structure of FIG. 3. However, the pad 2 has a bonding region BA wire-bonded to electrically connect to a corresponding pin, and so a bonding force is applied to lower layers. Thus, careful consideration in forming an electrical contact structure is required.

In the conventional art, ESD protection devices are formed under respective pads to reduce chip size. Nevertheless, with the above-mentioned conventional semiconductor devices, a weakened portion for pressure resistance in a connected part between a pad and a protection device is also generated, which in turn may lead to an electrostatic breakdown in the semiconductor device.

Thus, there is a need for a semiconductor device capable of improving electrostatic discharge protection without increasing the size of the device and which also provides an improved pressure resistance characteristic against static electricity.

SUMMARY OF THE INVENTION

Some exemplary embodiments of the invention provide a semiconductor device capable of improving electrostatic discharge protection without increasing the size of the device, and also provide increasing pressure resistance against static electricity.

Some exemplary embodiments of the invention provide a lower connection structure of a pad in a semiconductor device, which has a durability against a bonding force.

Some exemplary embodiments of the invention provide an electrical connection structure between a protection device and a bonding pad, and a connected method therefor, which is capable of improving a pressure resistance characteristic of electrostatic discharge protection device.

Some exemplary embodiments of the invention provide a lower connection structure of a pad in a semiconductor memory device, which has a contact structure resistant against an electrostatic breakdown.

Some exemplary embodiments of the invention provide an improved layout between an electrostatic discharge protection device and a bonding pad, which has a via contact between an upper part of region on which a protection device is formed, and a pad.

Some exemplary embodiments of the invention provide a contact connection structure improved in a pressure resistance against static electricity in a high-integrated semiconductor memory device employing a silicide formation process.

Some exemplary embodiments of the invention provide an improved layout structure of a metal layer, which is capable of improving a pattern of a metal layer formed on an upper part of metal contact and dispersing a current concentration in an electrostatic inflow.

In accordance with an exemplary embodiment, a semiconductor device is provided. The semiconductor device includes a diode region having a plurality of protection diodes and a pad region overlapped with an upper part of the diode region. The pad region having a pad installed corresponding to an external connection terminal. The semiconductor device further includes a contact plug unit which connects at least one of a plurality of active regions constituting the diode region and the pad within the diode region.

The contact plug unit may include a via contact part to electrically connect an upper metal layer and a lower metal layer. The via contact part is connected to the pad and positioned in a lower part of the pad, and the lower metal layer positioned in a lower part of the upper metal layer. The contact plug unit further includes a metal contact part, which electrically connects the lower metal layer and the active region and is positioned overlapping in a vertically lower part of the via contact part. The via contact part and the metal contact part respectively may have a plurality of unit via contacts and a plurality of unit metal contacts.

A pattern of the lower metal layer may be constructed of a first pattern having a gate frame shape extended corresponding to a first conductive active region of the diode region and a second pattern of a rectangular shape, which forms a web structure with the first pattern, and which is isolated from a unit gate frame of the first pattern within an open region of the first pattern, corresponding to a second conductive active region of the diode region.

The first conductive active region of the diode region may be substantially the same shape as the first pattern within the diode region, and the second conductive active region of the diode region may be substantially the same shape as the second pattern within the diode region. The external connection terminal may be a pin to transfer signals. The protection diode may be a p-type diode to discharge a positive static to protect an internal circuit when static electricity of a positive voltage flows into the pad, or may be an n-type diode to discharge a negative static to protect an internal circuit when static electricity of a negative voltage flows into the pad.

Moreover, one of the plurality of the active regions may be connected to a power line through a power connection metal contact outside the diode region. The power line may be a line to receive a power supply voltage or ground voltage.

If the first conductive active region is a high density n-type diffusion region, the second conductive active region may be a high density p-type diffusion region. The pad may be an input pad, an output pad or an input/output pad.

Meanwhile, if a metal layer formed by a damascene process is further formed in a lower part of the metal contact part, a tungsten contact part may be further formed in the lower part of the metal contact part.

In accordance with an exemplary embodiment of the present invention, a lower connection structure of a pad in a semiconductor device is provided. The lower connection structure of a pad in a semiconductor device includes a protection device, which has a first conductive active region having an extended gate frame shape in a well region formed on a substrate, and a second conductive active region isolated from the first conductive active region within an open region of the gate frame. The lower connection structure further includes a first metal layer, which has a first pattern having a shape overlapped with the extended gate frame shape on the first conductive active region, and a second pattern of a rectangular shape, which forms a web structure with the first pattern on the same layer, and which is isolated from a unit gate frame of the first pattern within an open region of the first pattern, corresponding to the second conductive active region. In addition, the lower connection structure also includes a second metal layer formed on the first metal layer, a pad that covers the protection device from an upper side, which is formed on the second metal layer and is connected to an external connection pin, a contact unit, which has a second via contact part which electrically connects the pad and the second metal layer, a first via contact part which electrically connects the second metal layer and the second pattern of the first metal layer in a vertically upper part of the second conductive active region, and a metal contact part vertically overlapped with the first via contact part, which electrically connects the second pattern of the first metal layer and the second conductive active region.

In accordance with an exemplary embodiment of the present invention, a lower electrical connection structure of an input/output pad in a semiconductor device having electrostatic discharge protection diodes in which first and second active regions are joined is provided. The lower electrical connection structure includes a plurality of power protection diodes connected to one of a power supply voltage or ground voltage and formed in a lower substantial center portion of the input/output pad and a plurality of signal protection diodes connected to the input/output pad and formed in a lower edge region of the input/output pad. The structure further includes at least one via contact for a vertical connection between the input/output pad and the second active region of the signal protection diode on the second active region.

In some exemplary embodiments of the invention, an electrostatic pressure resistance increases and thus an electrostatic discharge protection of protection diode may be improved. In addition, a load concentration to a connection part of the protection device is smoothened and dispersed, and thus the pressure resistance against static electricity is improved and further a contact connection structure having a durability against a wire bonding force may also be provided.

BRIEF DESCRIPTION OF THE DRAWINGS

Exemplary embodiments of the present invention can be understood in more detail from the following description taken in conjunction with the accompanying drawings in which.

DETAILED DESCRIPTION OF THE EXEMPLARY EMBODIMENTS

Figure 1:
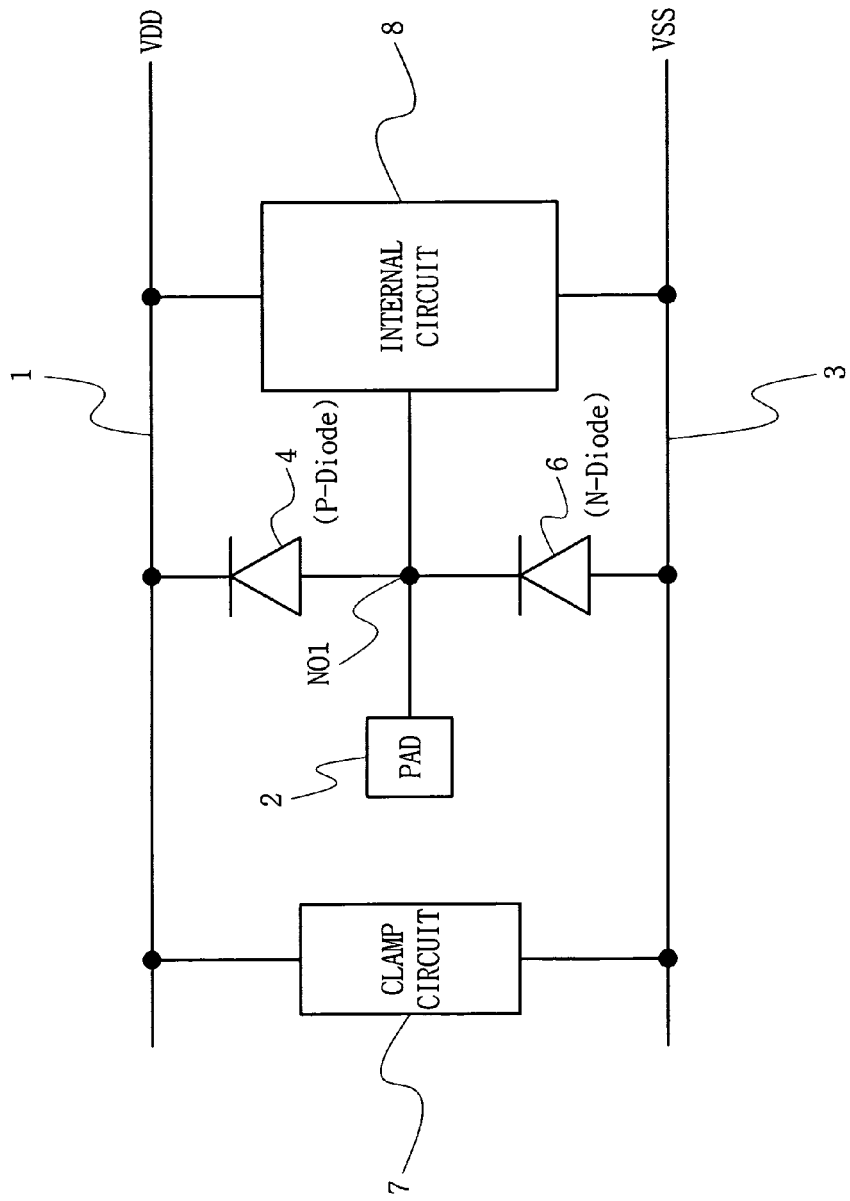
FIG. 1 illustrates wired protection device applied to a pad in a general semiconductor integrated circuit.
Figure 2:
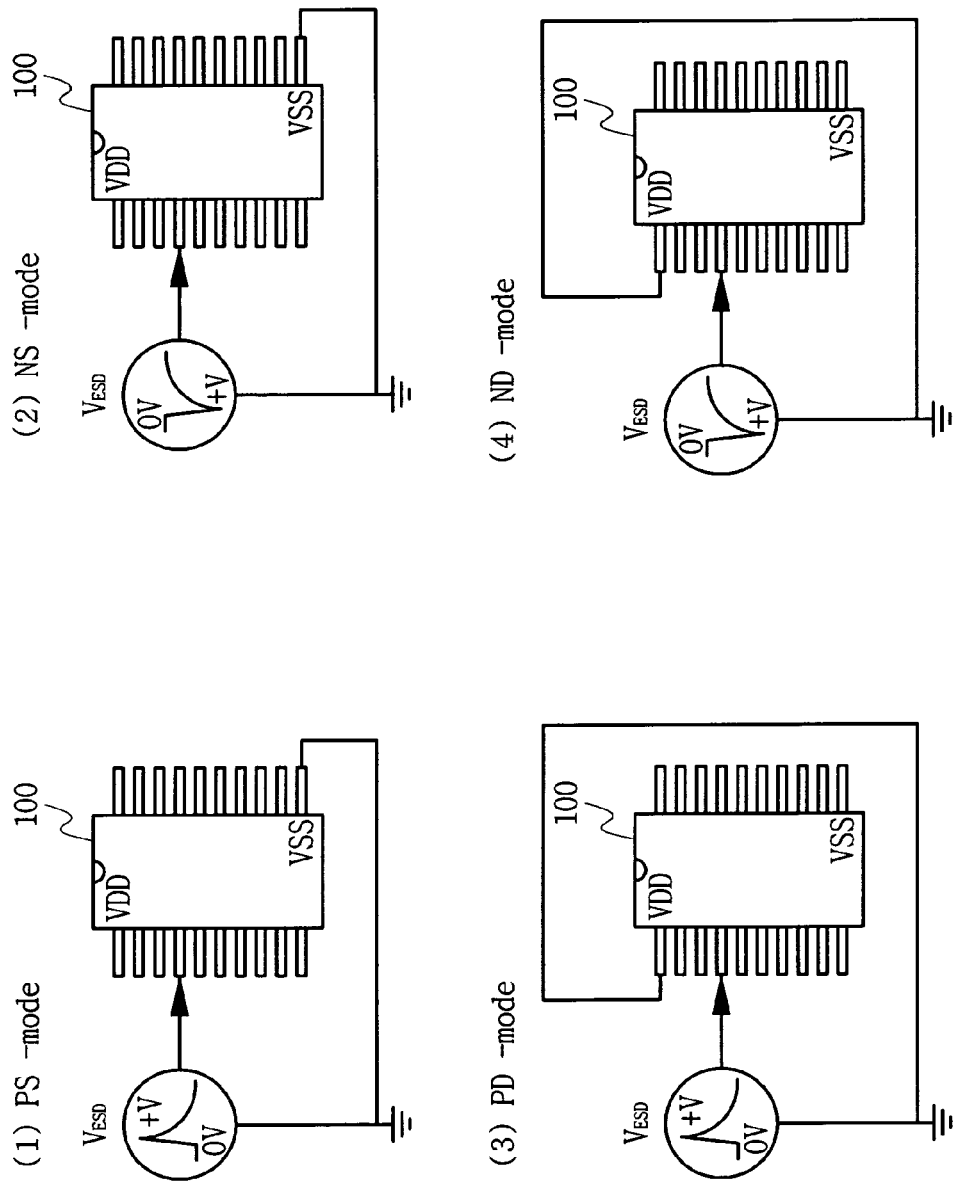
FIG. 2 illustrates various electrostatic discharge stress modes in a general semiconductor integrated circuit.

Exemplary embodiments of the present invention now will be described more fully hereinafter with reference to the accompanying drawings, in which exemplary embodiments of the invention are shown. This invention may, however, be embodied in many different forms and should not be construed as limited to the exemplary embodiments set forth herein. Rather these embodiments are provided so that this disclosure will be thorough and complete, and will fully convey the scope of the invention to those skilled in the art.

Hereinafter, exemplary embodiments of the present invention will be described in detail with reference to FIGS. 9 to 15 in which like reference characters refer to the same parts throughout the different views. It will be understood by those skilled in the art that the present invention can be embodied by numerous different types and is not limited to the following described exemplary embodiments. The following various embodiments are exemplary in nature.

A connection structure between a pad and a protection diode will be described referring first to FIGS. 4 to 8 according to the conventional art, only for a more thorough understanding of the exemplary embodiments of the invention.

Figure 4:
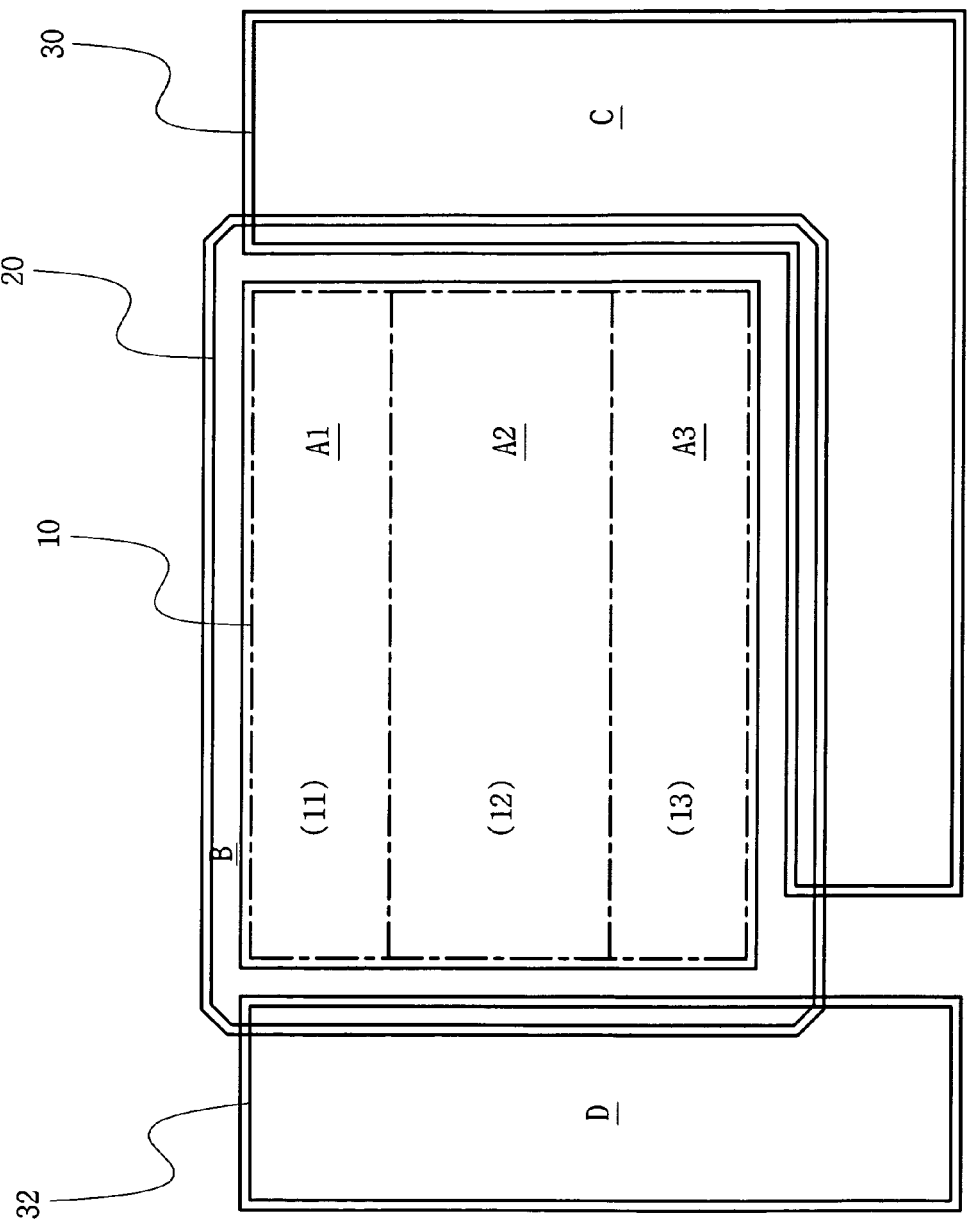
FIG. 4 illustrates regions where a protection device and a pad shown in FIG. 1 are formed.
Figure 5:
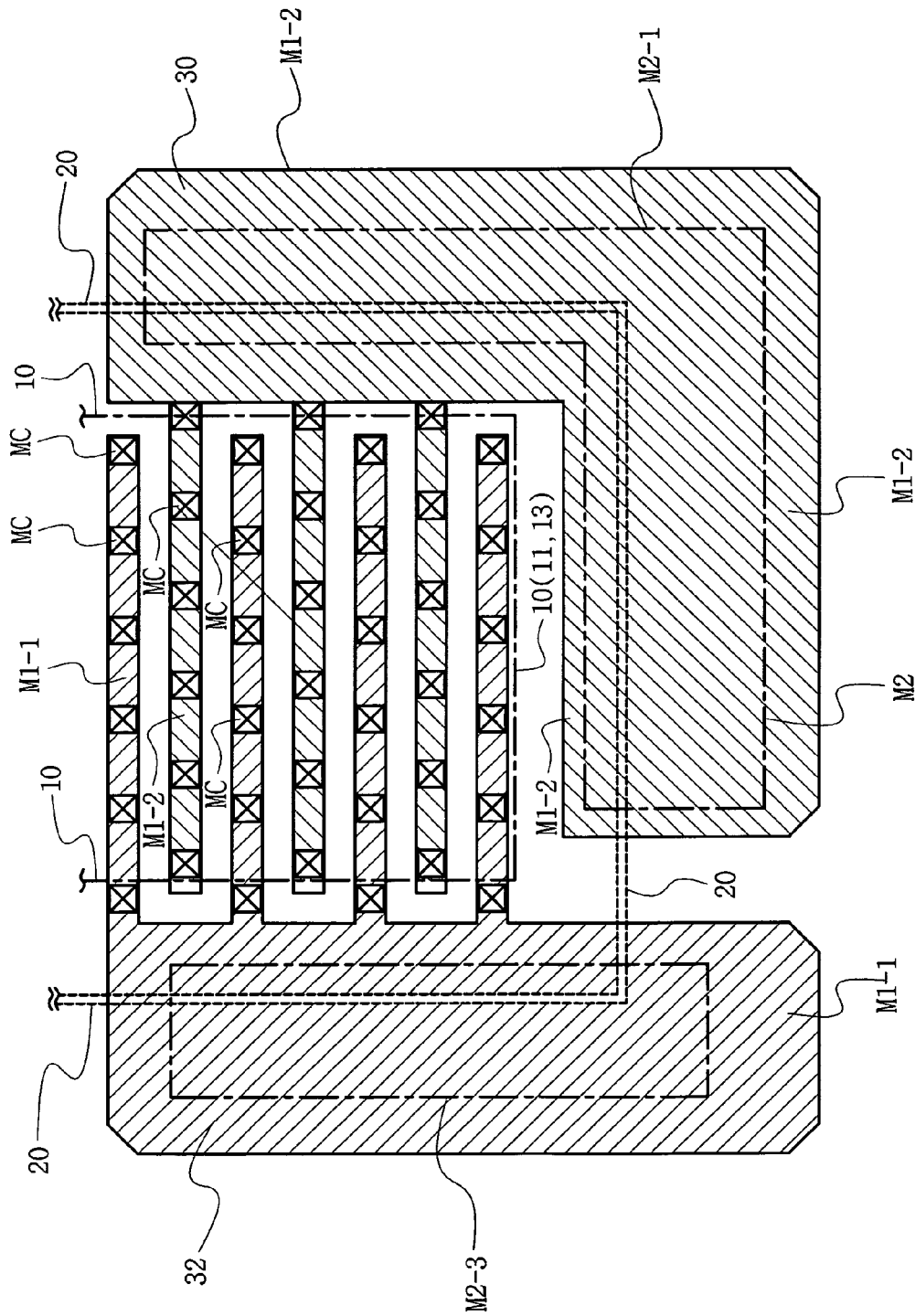
FIG. 5 is a plan view illustrating a layout of a metal contact and pattern of a metal layer in protection devices according to the conventional art.
Figure 6:
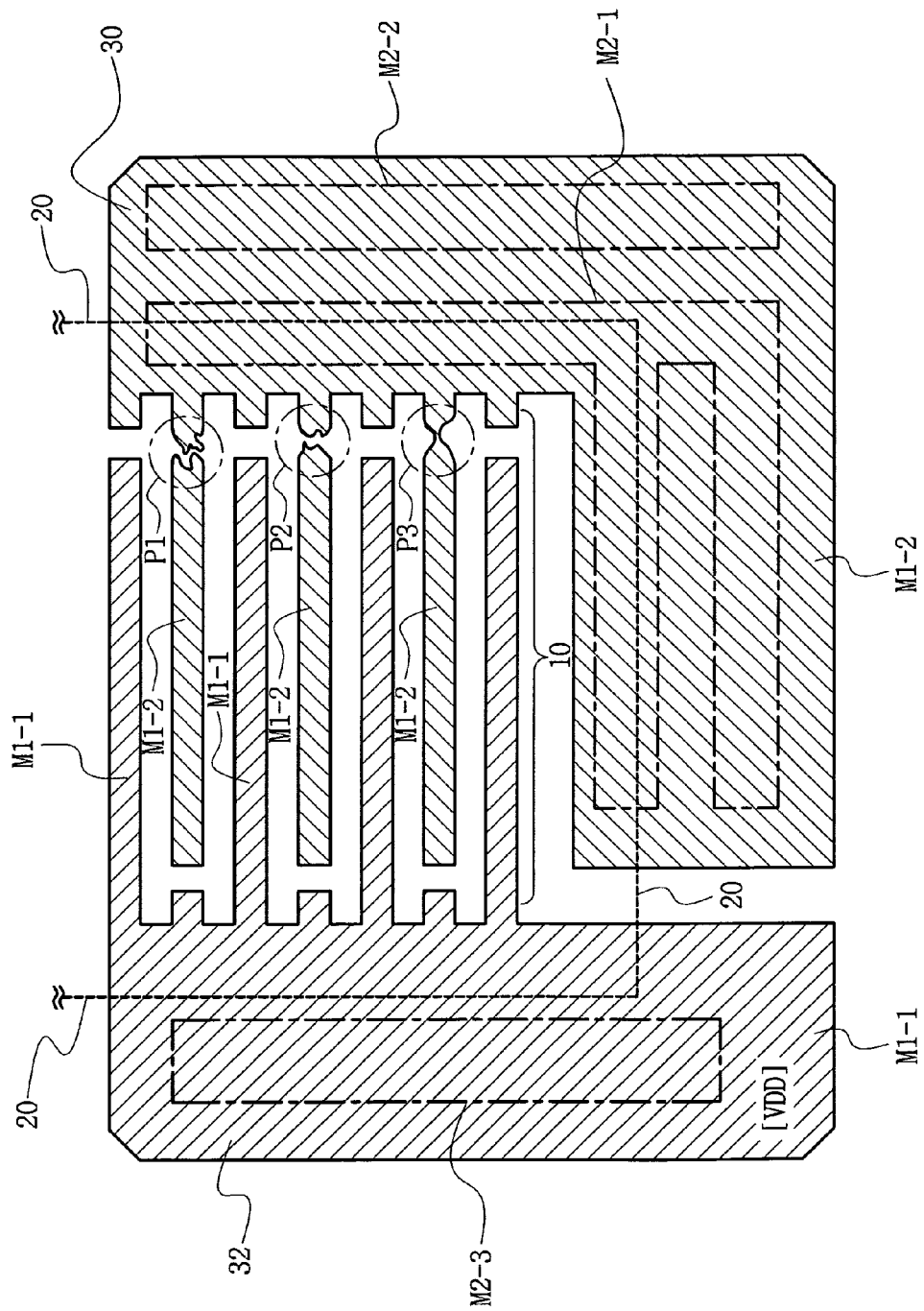
FIG. 6 illustrates portions on which an electrostatic discharge breakdown is generated concentrating, in a conventional layout structure of FIG. 5.
Figure 7:
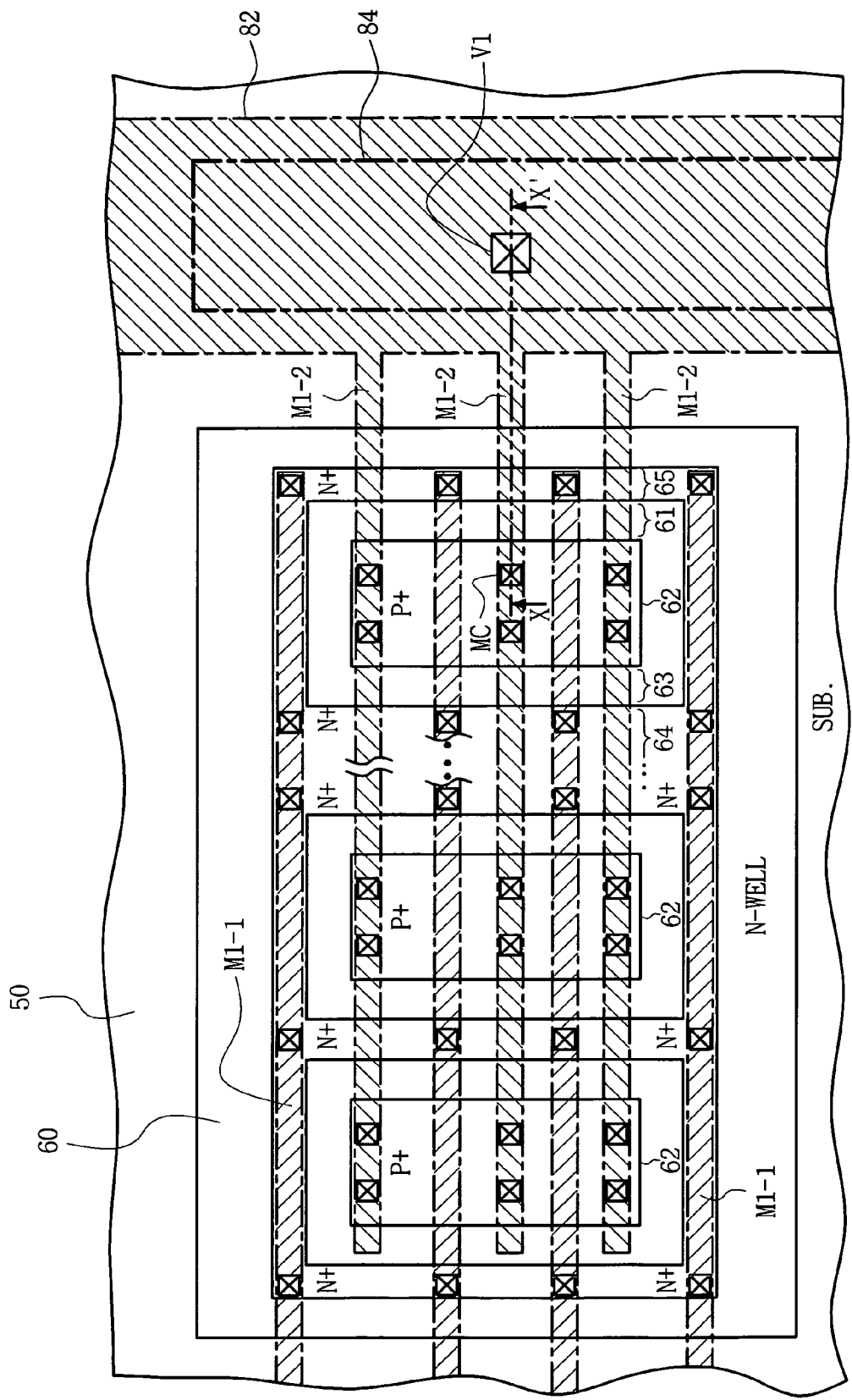
FIG. 7 is a layout with an active region of the protection device shown in FIG. 1 in a conventional layout structure of FIG. 5.
Figure 8:
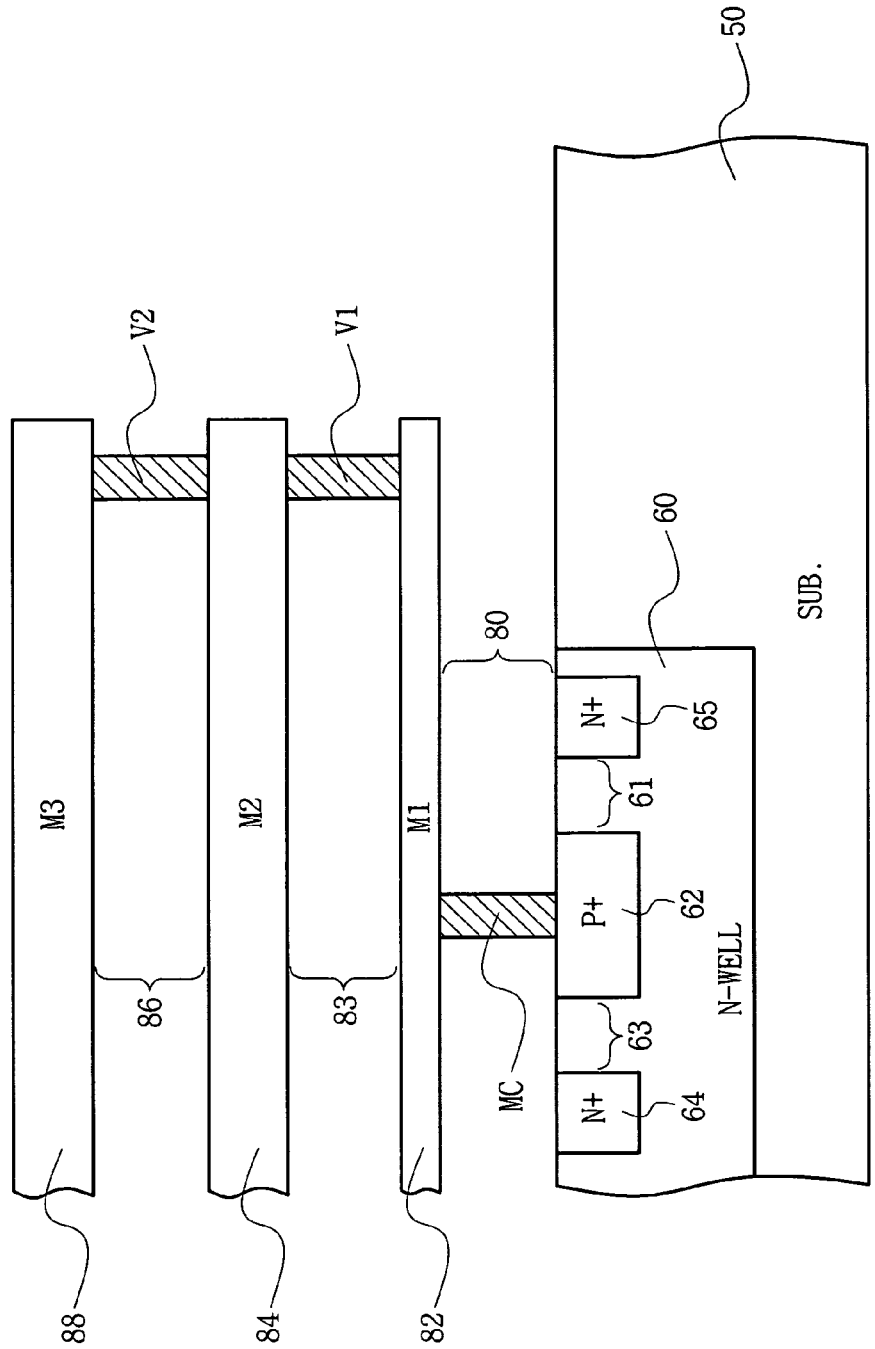
FIG. 8 is a sectional view taken along a line X-X' of FIG. 7 of the conventional art, to illustrate an electrical connection between a pad and an active region.

FIG. 4 illustrates regions in which protection devices and a pad shown in FIG. 1 are formed. FIG. 5 is a plan view illustrating a layout of a metal contact and patterns of a metal layer for the protection device according to the conventional art. FIG. 6 illustrates portions on which an electrostatic discharge breakdown is generated concentrating thereon in the conventional layout structure of FIG. 5. FIG. 7 is a layout with an active region of a protection device shown in FIG. 1 in the conventional layout structure of FIG. 5. FIG. 8 is a sectional view taken along a line X-X' of FIG. 7 of the conventional art, to illustrate an electrical connection between a pad and an active region.

Figure 3:
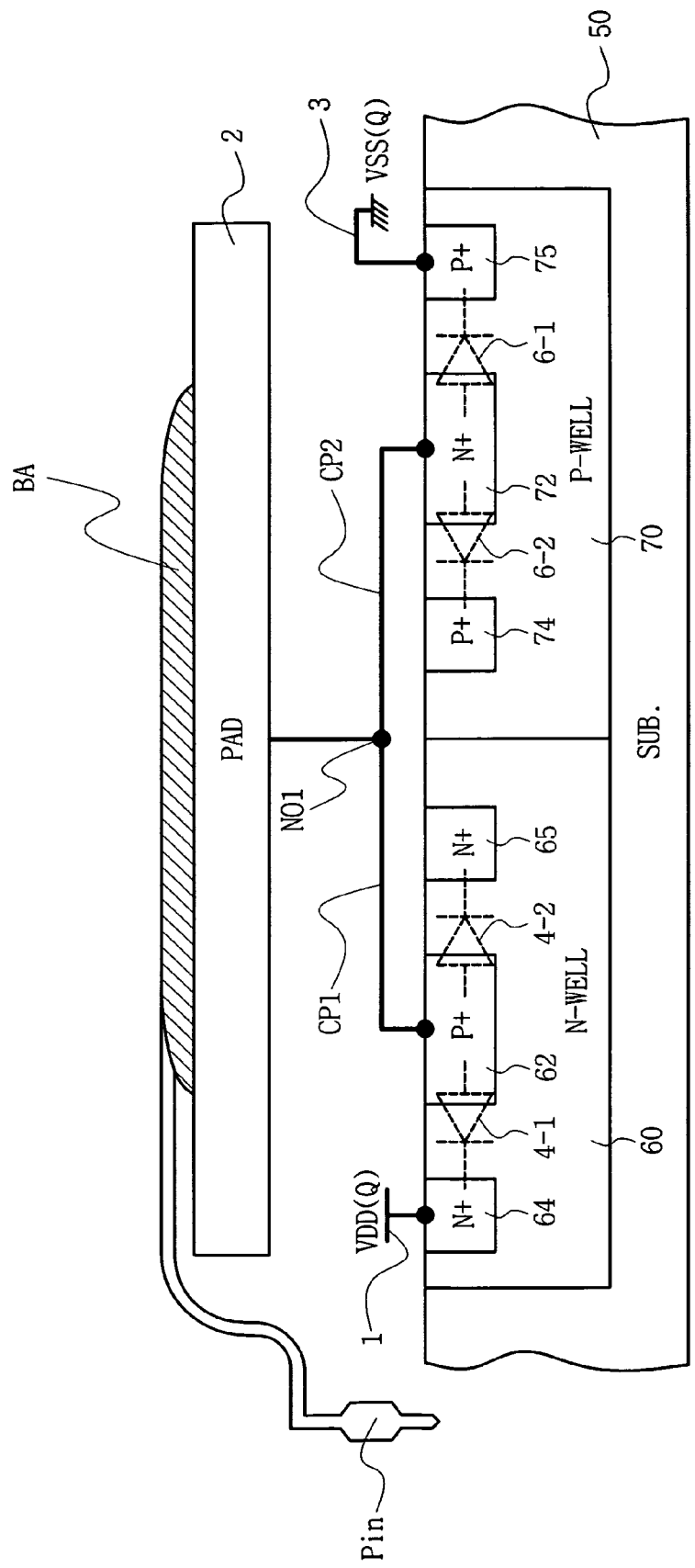
FIG. 3 is a schematic sectional view illustrating a general example that a protection device of FIG. 1 is formed on a substrate.

Referring to FIG. 4, a pad region 20 is formed corresponding to an external connection terminal such as, for example, a pin. Also, a device formation region 10, on which protection diodes are formed, exists in the pad region 20. In the vertical structure, the pad region 20 is formed, completely covering the device formation region 10 from an upper side of the device formation region 10. On the edge of the pad region 20, metal layer formation regions 30 and 32 are formed overlapping with a portion of the pad region 20. In the metal layer formation regions 30 and 32, via contacts are formed to arrive at the structure of FIG. 3. That is, though in the conventional layout structure, protection diodes are disposed in a lower part of the pad region 20, to obtain a connection between one end of protection diode and the pad, the metal layer formation regions 30 and 32 are used. When the via contact is formed in the metal layer formation regions 30 and 32, a bonding force, which is generally generated from a vertically lower part in a center portion of the pad region 20, does not damage the via contact significantly.

In FIG. 4, meanwhile, the device formation region 10 may be divided into three regions 11, 12 and 13. For example, a plurality of p-type diodes 4 shown in FIG. 1 may be formed in a region A1, and a plurality of n-type diodes 6 shown in FIG. 1 may be formed in a region A3. In the region A2, a plurality of p-type or n-type diodes connected to a pad different from the pad 2 of FIG. 1 may be formed.

In the region A1 of FIG. 4, for example, if the plurality of p-type diodes 4 of FIG. 1 are formed, conventional patterns of the first metal layer vertically connected to active regions of protection diode are disposed as shown in FIG. 5.

Referring to FIG. 5, the pad region 20 shown in FIG. 4 is shown with a double-dot line and the same reference number. Regions 10, 30 and 32 of FIG. 5 correspond to the regions of FIG. 4, and each indicate a device formation region and metal layer formation regions. In FIG. 5, the regions 30 and 32 of mutually opposite-directional oblique lines in the drawing indicate a first metal layer M1 (reference numeral 82 of FIG. 8) in a finger-engaging shape in the device formation region 10. A reference character MC indicates a metal contact. One of active regions of the protection diode disposed under the metal contact is electrically connected to the first metal layer that may be called a metal first-layer through the metal contact. A metal contact MC formed in the metal layer formation region 30 electrically connects P+ region 62 of FIG. 3 and the first metal layer M1-2. A metal contact MC formed in the metal layer formation region 32 electrically connects N+ region 64 of FIG. 3 and the first metal layer M1-1. In regions M2-1 and M2-3, a via contact V1 shown in FIG. 8 is formed through a subsequent process.

Like in the pattern shown in FIG. 5, in case the first metal layer has a finger-engaging shape in the device formation region 10, an electrostatic breakdown may occur as shown in FIG. 6.

FIG. 6 illustrates portions where generated electrostatic discharge breakdown is being concentrated in the conventional layout structure of FIG. 5. For example, a current concentration by static electricity is generated on portions shown with reference characters P1, P2 and P3 and so the metal layer may be broken. That is, in the conventional art, the first metal layer has a structure of a finger engaging shape in the device formation region 10. Thus, the pressure resistance in a connection part of the protection device with reference characters P1, P2 and P3, as a finger part, becomes weak, and so the metal layer may be readily broken. As a result, a protection function may be lost from the electrostatic discharge protection diode 4.

FIG. 7 illustrates a layout with an active region of the protection device shown in FIG. 1 in the conventional layout structure of FIG. 5. With reference to FIG. 7, the metal contact MC formed in the metal layer formation region 30 of FIG. 6 electrically connects a P+ region 62 of FIG. 3 and the first metal layer M1-2. Additionally, the metal contact MC formed in the metal layer formation region 32 of FIG. 6 electrically connects N+ region 64, 65 of FIG. 3 and the first metal layer M1-1. FIG. 8, illustrates a vertical electrical connection between the pad 2 and a second active region P+ as a diffusion region. It may be understood that FIG. 8 is a sectional view taken along a line X-X' of FIG. 7 according to the conventional art. A third metal layer 88 may be a pad layer, and a second metal layer 84 is connected to the third metal layer 88 through a second via contact V2 formed within an inter-metal dielectric layer 86.

With reference to FIG. 8, a via contact V1 formed on the first metal layer 82 is provided on an upper portion of substrate 50, deviating from a well region 60 of the formation region 10 of the protection diode.

That is, in the conventional art, the metal layer formation regions 30 and 32 shown in FIG. 4 are all needed to form a via contact outside the device formation region 10, which in turn may become a factor in preventing a layout size reduction of the semiconductor device.

As described above, in the conventional art, the first metal layer M1 has a finger engaging shape in the formation region 10 of the protection device, and thus the pressure resistance of electrostatic discharge protection diode may be lowered. In addition, in the conventional art, the via contact is formed deviating from the formation region of the protection device, Consequently, it may be difficult to reduce the layout size of the semiconductor device.

A contact structure to resolve the above-mentioned difficulties of the conventional art will be described as follows, referring to FIGS. 9 to 15 according to exemplary embodiments of the invention. The contact structure according to some exemplary embodiments of the invention has durability against a wire bonding force, with a via contact within a formation region of protection device, and is also capable of improving the electrostatic pressure resistance characteristic of an electrostatic discharge protection device.

Figure 9:
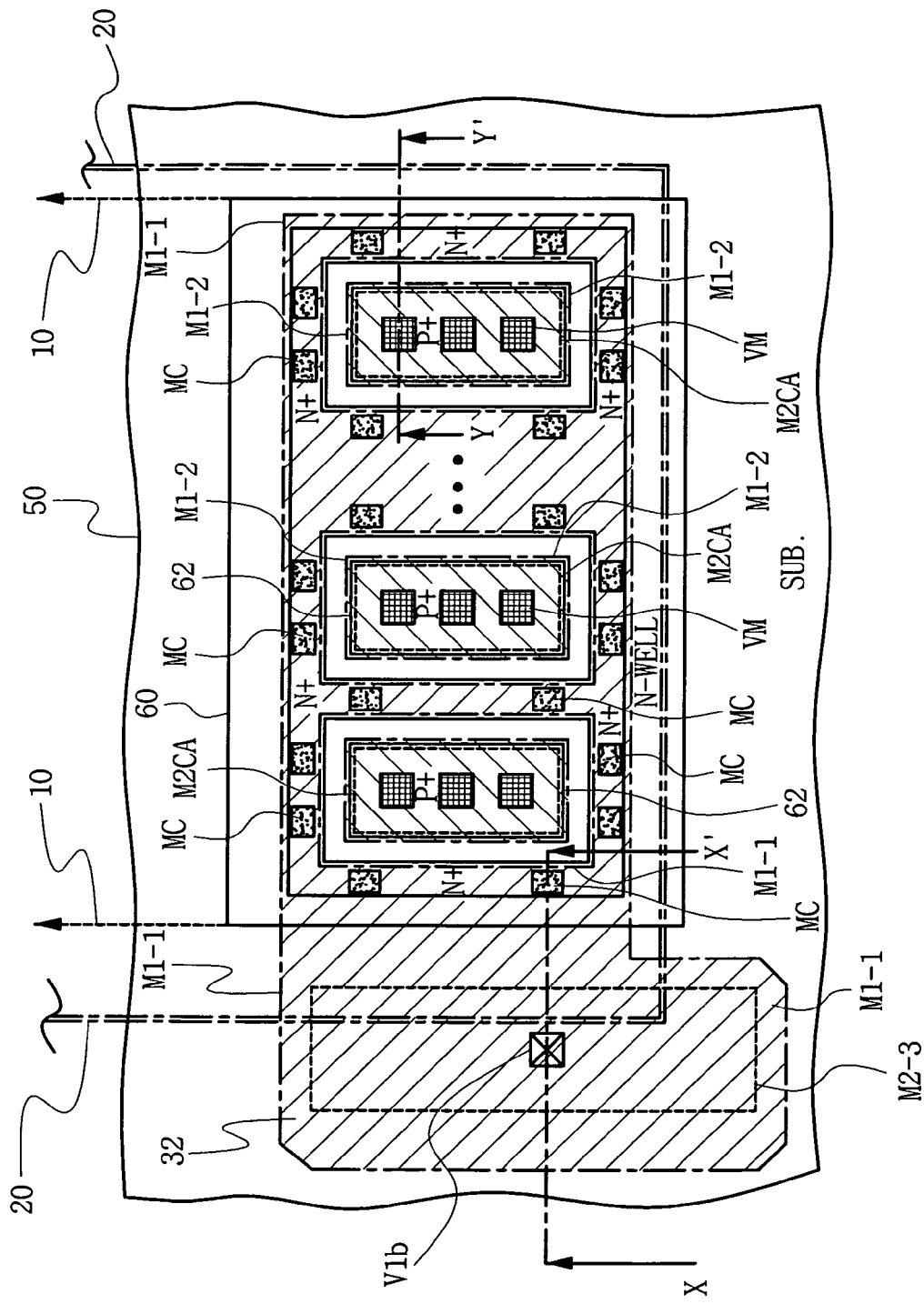
FIG. 9 illustrates a lower connection structure of pad to show an electrical connection structure between an electrostatic discharge protection device and a bonding pad according to an exemplary embodiment of the invention.

FIG. 9 illustrates a lower connection structure of pad to show an electrical connection structure between an electrostatic discharge protection device and a bonding pad according to exemplary embodiments of the invention, in a layout centering on a first metal layer M1. As shown in FIG. 9, the pattern of the first metal layer M1 is substantially different from that of FIG. 7 of the conventional art.

Figure 12:
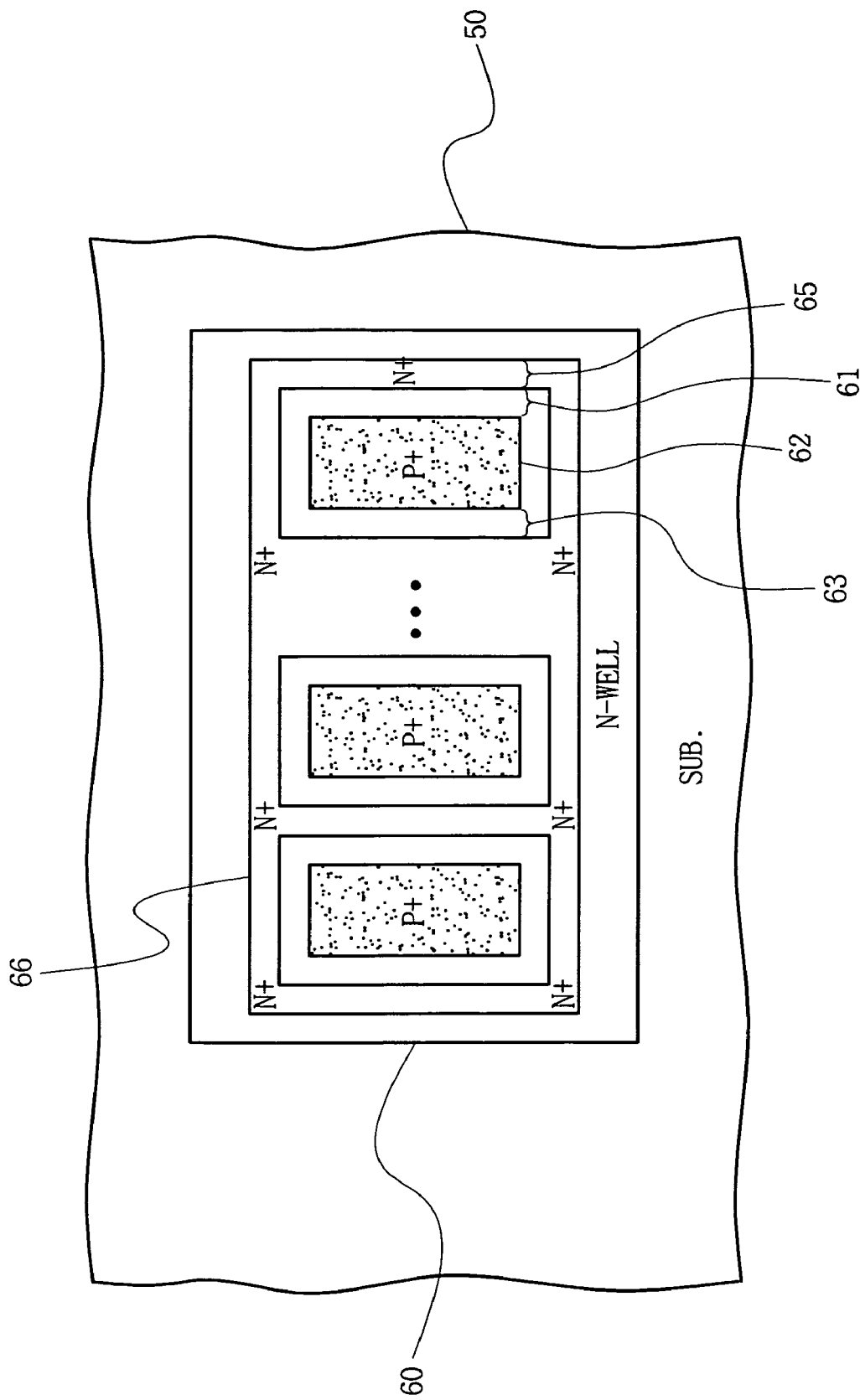
FIG. 12 illustrates a layout of active region of a protection device to obtain the layout of FIG. 9.
Figure 13:
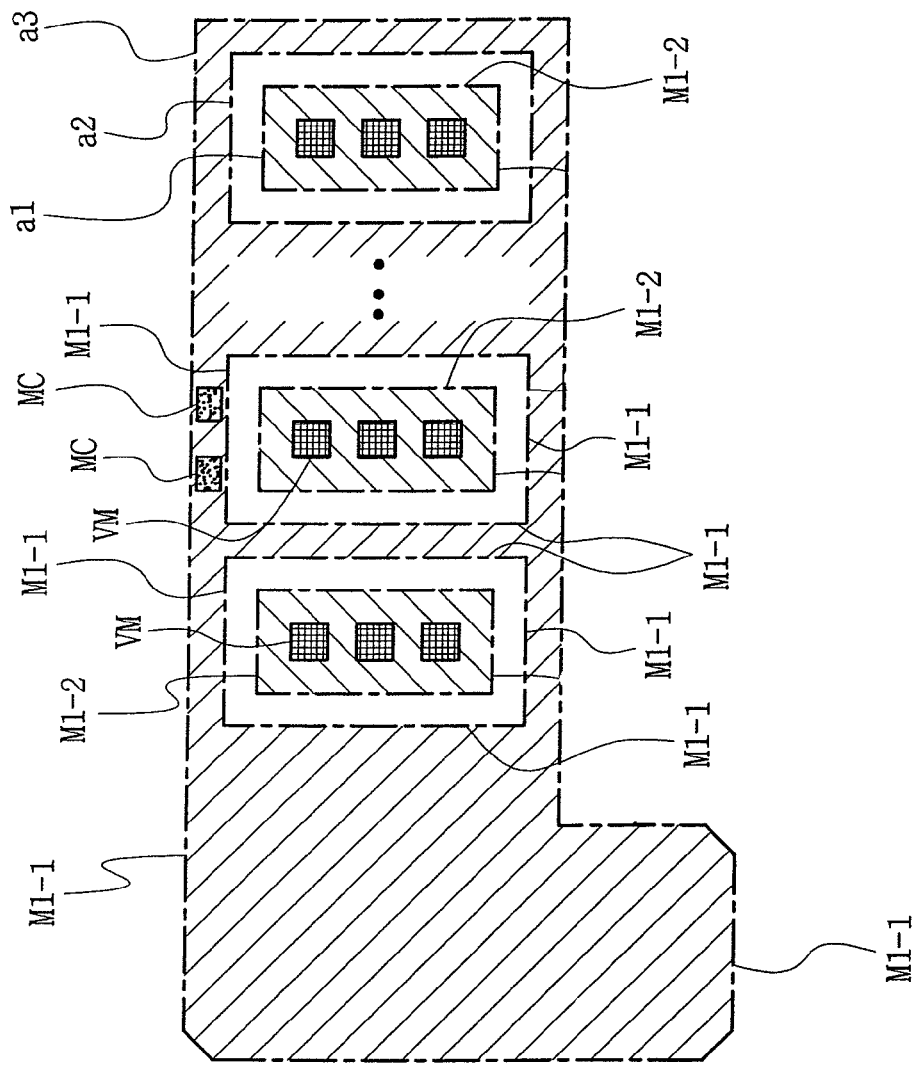
FIG. 13 illustrates a layout pattern of first metal layer formed on a substrate of FIG. 12 to provide the layout of FIG. 9.

The structure of FIG. 9 is provided as a combined layout structure of FIGS. 12 and 13. A first pattern shown with reference number M1-1 has a gate frame shape M1-1 of FIG. 14 extended corresponding to a first conductive active region N+ in the protection diode region 10. A second pattern shown with reference number M1-2 has a web structure with the first pattern M1-1, and has a rectangular shape as a square connected through a1-a2-a3-a4 of FIG. 14. The second pattern is also isolated from a unit gate frame of the first pattern in an open region of the first pattern M1-1, corresponding to a second conductive active region P+ of the diode region 10. The unit gate frame of the first pattern being a frame of a square connected through A1-A2-A3-A4 of FIG. 14. In other words, a contact VM shown in FIG. 9 designates that a metal contact MC is overlapped with a via contact V1 as shown in FIG. 10.

An electrical connection between one of active regions constituting the diode region 10, for example, P+ region, and the pad 2 (reference number 88 in FIG. 10), is in charge of a contact plug that is provided as the contact VM. The contact plug is positioned in the diode region 10. In this case, thus, the region 30 of FIG. 4 is not needed.

Figure 10:
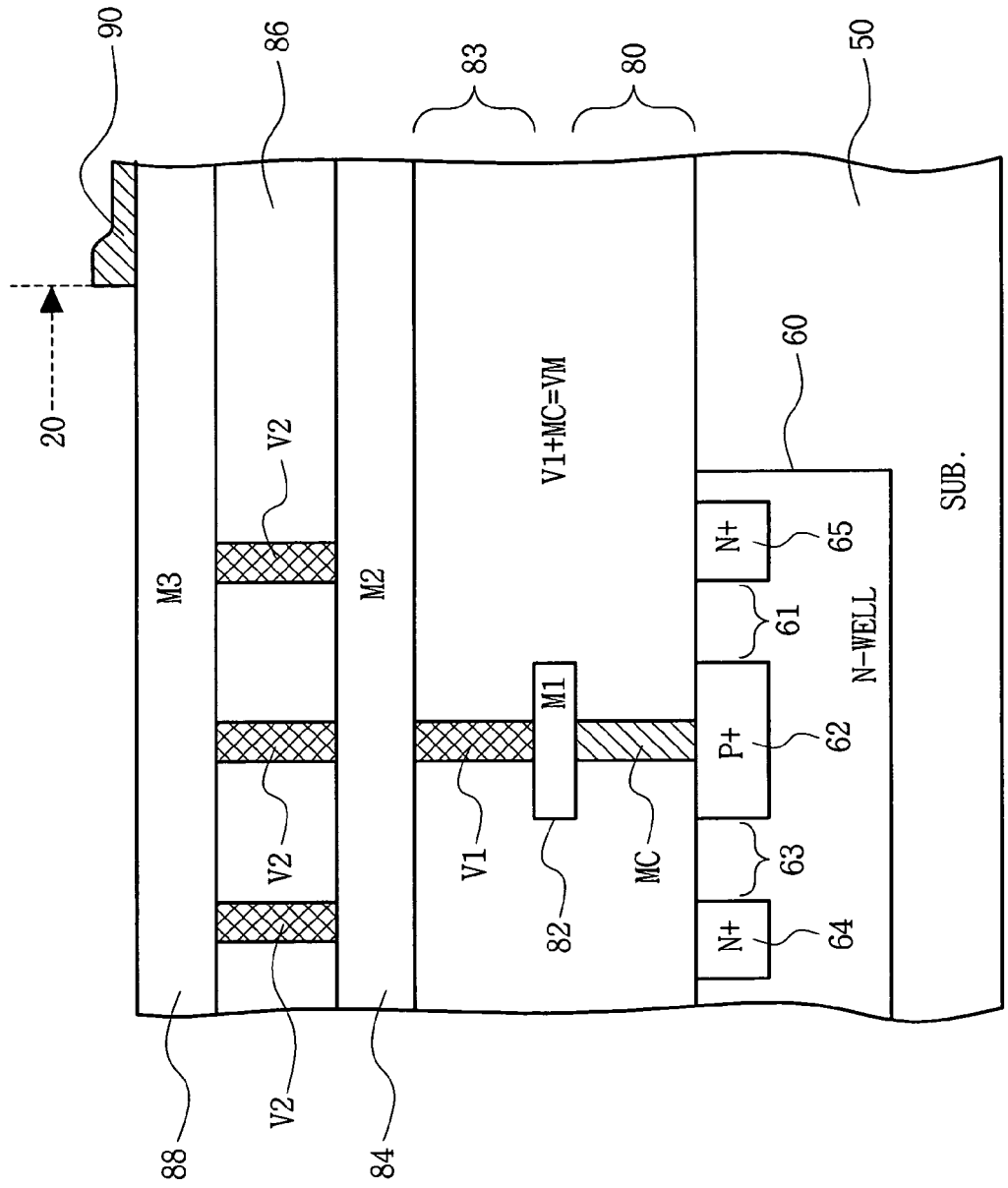
FIG. 10 is a sectional view taken along a line Y-Y' of FIG. 9.

As shown in FIG. 10, the contact plug unit constructed of the combination contact VM may include a via contact part V1 and a metal contact part MC. The via contact part V1 electrically connects an upper metal layer 84 connected to the pad 88 and positioned in a lower part of the pad and a lower metal layer 82 positioned in a lower part of the upper metal layer 84. The metal contact part MC, electrically connects the lower metal layer 82 and the active region 62 and is positioned in a vertically lower part of the via contact part V1, overlapping with the via contact part V1. Reference character M2CA of FIG. 9 indicates a region where via contacts V2 of FIG. 10 will be formed.

Figure 11:
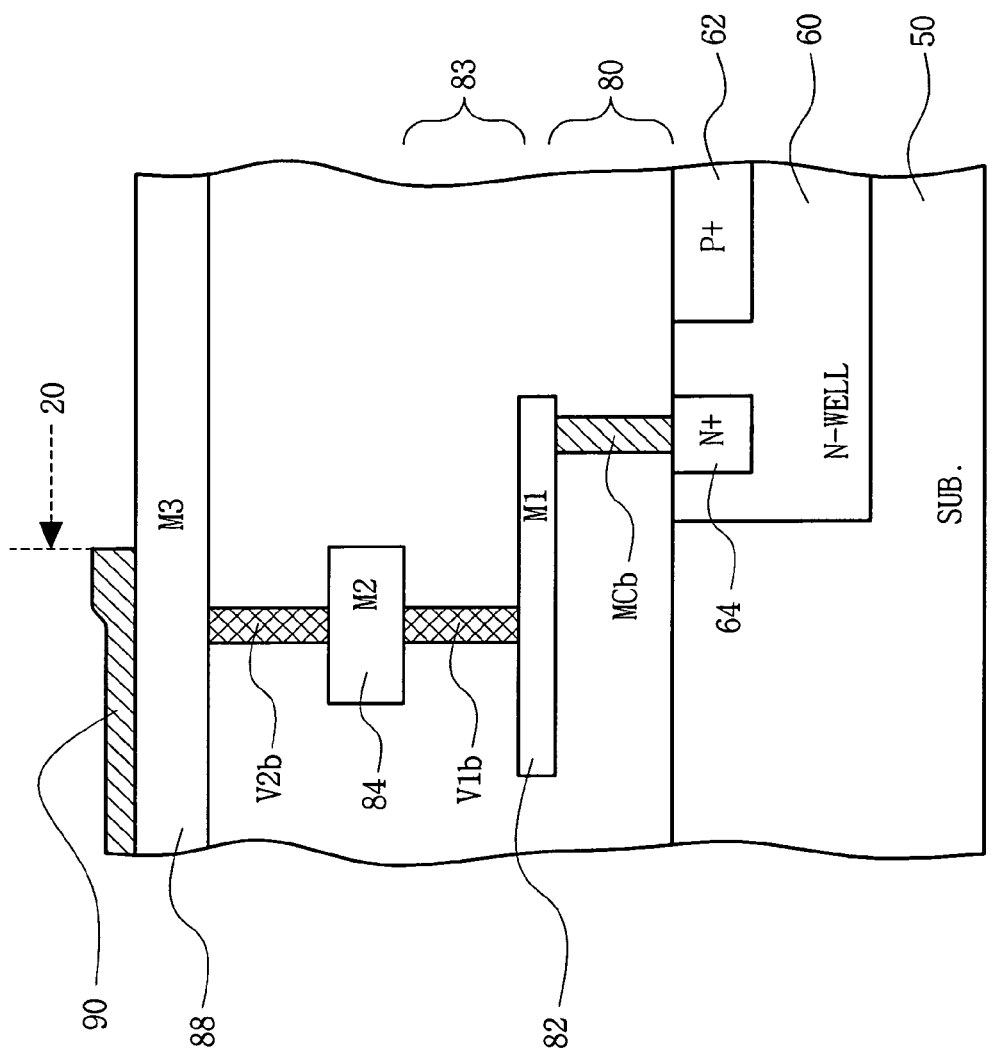
FIG. 11 is a sectional view taken along a line X-X' of FIG. 9.

FIG. 10 is a sectional view taken along a line Y-Y' of FIG. 9, and FIG. 11 is a sectional view taken along a line X-X' of FIG. 9. FIG. 12 illustrates a layout for an active region of a protection device to obtain the layout of FIG. 9. FIG. 13 illustrates a layout pattern of first metal layer formed on a substrate of FIG. 12. In some exemplary embodiments of the invention, the pattern of the first metal layer has a virtually identical shape with active regions of the protection device provided in a lower part of the first metal layer, being overlapped therewith. The first, second and third metal layers M1, M2 and M3 may be made of metal having satisfactory conductivity, for example, an aluminum material.

Figure 14:
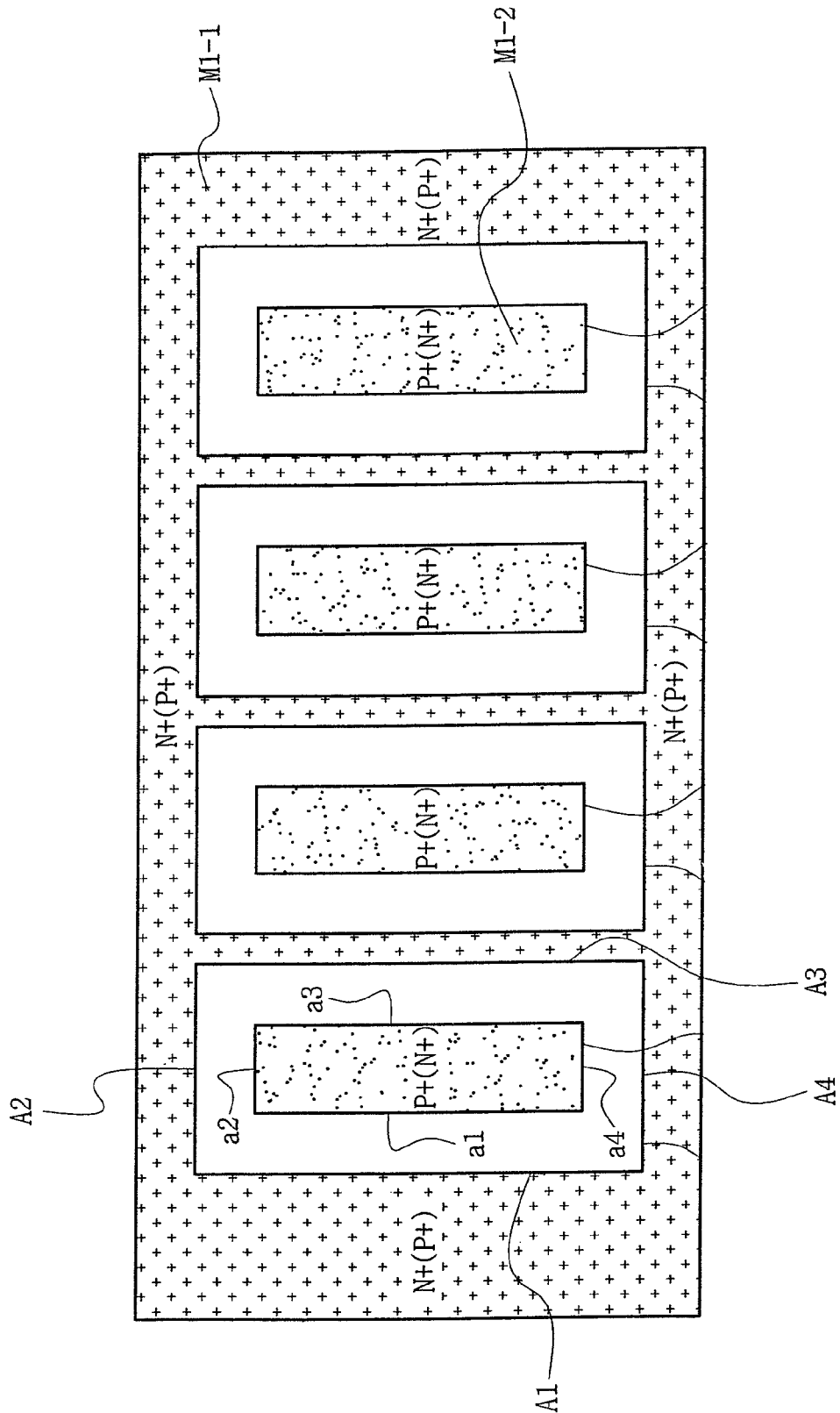
FIG. 14 illustrates layout patterns of a first metal layer or damascene metal layer shown in FIG. 13 in a protection device formation region.

FIG. 14 illustrates layout patterns of a first metal layer or damascene metal layer shown in FIG. 13 in a protection device formation region, and the first pattern M1-1 and the second pattern M1-2 have a web structure. The web structure is named herein as a combined structure of an extended gate frame and a rectangular shape because this combined structure has a web shape. The gate frame is formed of a plurality of adjacent unit gate frames having the first pattern as a square frame connected through A1-A2-A3-A4 shown in FIG. 14, and the gate frame is named herein as it is just like a doorframe. The second pattern M1-2 of the first metal layer, in which respective unit gate frames are isolated from one another, with a substantially rectangular shape as a square connected through a1-a2-a3-a4 shown in FIG. 14, is formed almost identically overlapping with a layout of second active region P+ region.

Figure 15:
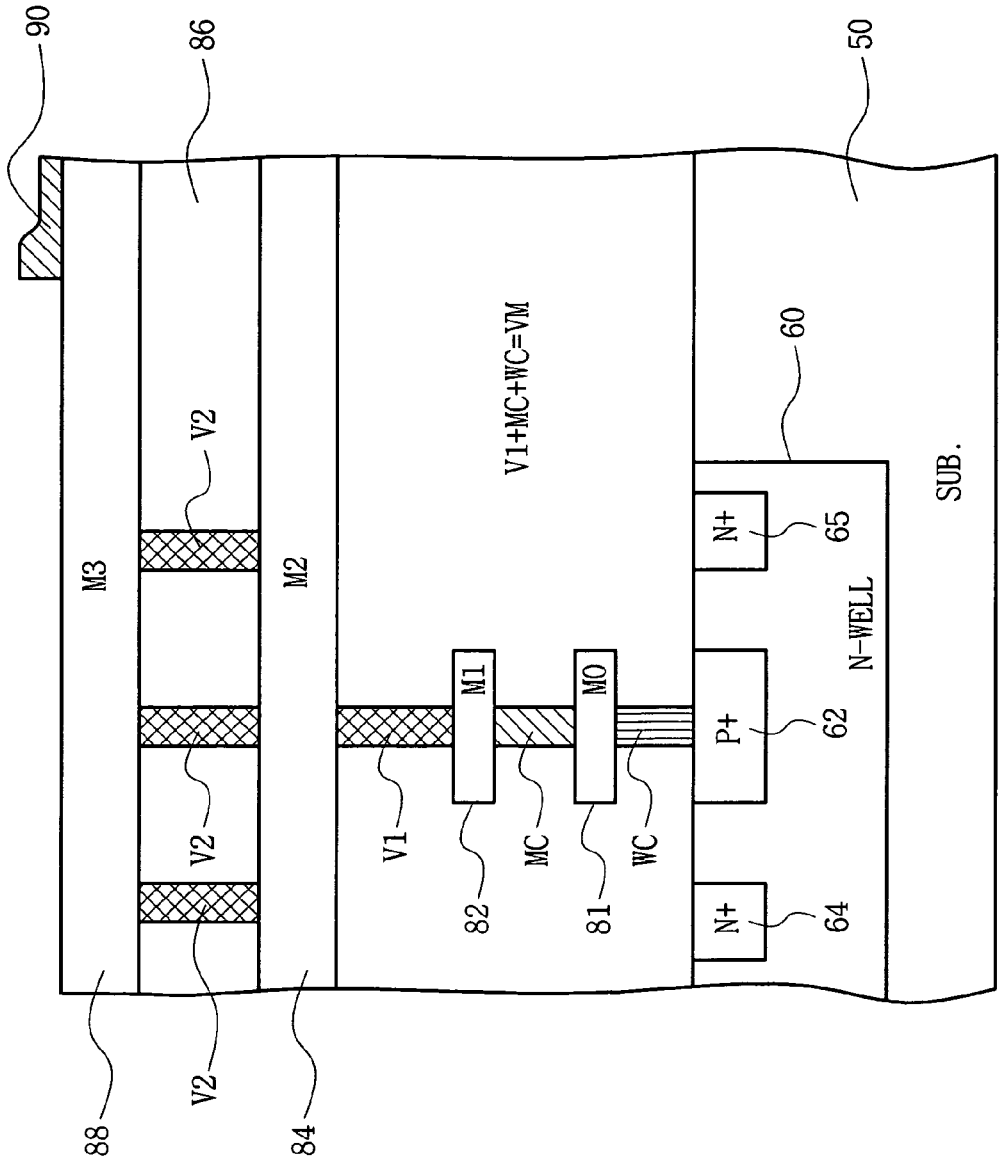
FIG. 15 is a sectional view enlarged from the sectional structure of FIG. 10 according to an exemplary embodiment of the invention.

FIG. 15 is a sectional view enlarged from a sectional structure of FIG. 10 according to exemplary embodiments of the invention. In FIG. 15, an active region 62 is connected to a metal zeroth-layer M0 (reference numeral 81 in FIG. 15) through a tungsten contact WC, and the metal zeroth-layer 81 is connected to a metal first-layer M1 (reference numeral 82 in FIG. 15) through a metal contact MC. The metal first-layer M1 is connected to a metal second-layer M2 (reference numeral 84 in FIG. 15) through a via contact V1, and the metal second-layer 84 is connected to a metal third-layer M3 (reference numeral 88 in FIG. 15) as the pad layer, through a second via contact V2. According to some exemplary embodiments, a metal zeroth-prime layer M0P may be further formed between the metal zeroth-layer M0 and the metal first-layer M1. The metal zeroth-layer M0 and the metal zeroth-prime layer M0P may be formed by a metal damascene process using a metal such as, for example, tungsten. Details for the metal damascene process appropriate to a formation of detailed patterns are well known to those skilled in the art and thus will be omitted from the following description.

Contrary to a conventional metal layer structure having a finger engaging structure, the structure for a metal layer according to some exemplary embodiments of the invention may be achieved by changing a mask pattern in a photolithography process.

Referring back to FIGS. 10 and 11 to schematically illustrate a connected method between an electrostatic discharge protection device and a pad, an N-type well 60 is formed by implanting ions of a first conductive type into a substrate 50 as a semiconductor substrate through a well-know ion implantation method, and then by performing a diffusion process. In addition, a P-type well is formed on the periphery of the N-type well 60 on the boundary of a shallow trench isolation. A p-type diffusion region 62 is formed by implanting ions of a second conductive type in a high density and then by performing a diffusion process. N-type diffusion regions 64 and 65 are formed by implanting ions of the first conductive type in a high density and then by performing a diffusion process. After depositing a first insulation layer 80 such as, for example, an oxide layer, a contact hole is formed, and the contact hole is then filled with metal. Subsequently, a metal contact MC forming process is performed to produce a contact plug. After the formation of metal contact MC, a first metal layer 82 of a material such as, for example, aluminum is deposited on the metal contact MC and the first insulation layer 80. Then, a photolithography process using a photosensitive layer such as, for example, photoresist is performed for the first metal layer 82, and a metal layer etching process is performed, thereby forming first and second patterns M1-1 and M1-2 shown in FIG. 13. The first pattern M1-1 and the second pattern M1-2 together have a web structure. A second insulation layer 83 is deposited on the first and second patterns M1-1 and M1-2. Next, a via contact hole is formed and a formation process of via contact V1 to form a via contact plug is performed. In this case, the via contact V1 is formed at a position of contact VM shown in FIG. 9, thereby forming the via contact V1 overlapping at a vertical upper part of the metal contact MC. Meanwhile, with reference to FIG. 11, a metal contact MCb is formed together with the formation of the metal contact MC shown in FIG. 10. A via contact V1b is also formed together with the formation of the via contact V1. The via contact V1b is formed in a region 32 shown in FIG. 9, while, the via contact V1 is formed in an active region 62 of the diode region 10. Though the via contact and the metal contact are shown respectively as one contact plug in the drawings, the exemplary embodiments of the invention are not limited thereto but rather it is well known to those skilled in the art that a plurality of contact plugs may also be formed in a plurality of contact holes.

The second metal layer composed of material such as, for example, aluminum is deposited on the via contact V1, V1b and the third insulation layer 83. After the second metal layer 84 is patterned as a predetermined shape by a photo etching process, a fourth insulation layer 86 is deposited thereon. The interior of the fourth insulation layer 86 is formed in a mesh structure so that the second via contact V2 performs an efficient dispersion of power.

An upper part of the second via contact V2 is covered with a third metal is layer 88, and then is covered with a passivation layer 90. Immediately before a bonding process of pad, the passivation layer 90 covering the third metal layer 88 is opened, and the opened region corresponds to a pad formation region 20. In the pad bonding, a bonding force is concentrated to a lower part of region 12 shown in FIG. 4. Consequently, the protection device is disposed and the via contact is formed on region 11, 13 deviated from the region 12, thereby reducing damage from the bonding force. In other words, without a region 30 shown in FIG. 6, a contact structure having durability against a wire bonding force is provided. The size a1 of FIG. 13 is significantly larger than the size of connection part P1, P2, P3 shown in FIG. 6, and thus a sectional area through which current passes is relatively large according to exemplary embodiments of the invention. Loading of a line is dispersed, and in the electrostatic inflow, current is dispersed to respective active regions without a current concentration to a specific portion, and thus the pressure resistance characteristic can be obtained without a breakdown over about 800 V.

Further, in the pattern formation of metal layer like in FIG. 13, a variation of critical dimension is less in comparison to that of a conventional art structure, and so the pattern of the exemplary embodiments is a more photolithography friendly process, thereby resulting in a more reliable circuit layout and increased production yield of products in comparison to the conventional art.

The metal first-layer M1 may be used to form a bit line in a memory cell array region. According to some exemplary embodiments of the invention, a pin ESD protection circuit is a diffusion diode type, but an ESD protection circuit may be utilized as a MOS type.

Consequently, in some exemplary embodiments of the invention, a vertically direct contact from a diffusion region of protection diode to a pad is obtained and thus a discharge function of diode may become larger, thereby an ESD level can be significantly increased.

In applying the protection circuit to a semiconductor memory device, for example, SRAM, according to some exemplary embodiments, a memory cell may be, for example, a full CMOS SRAM (Complementary Metal Oxide Semiconductor Static Random Access Memory) cell constructed of six transistors. When a cell pitch of SRAM cell is further reduced approximate to a resolution limitation of currently photolithography process, the six transistors can be divided and disposed on different layers without a layout of the same layer.

As described above, according to some exemplary embodiments of the invention, an electrostatic pressure resistance increases and so an electrostatic discharge protection of protection diode is improved. In addition, a concentration of load to a connection part of protection device is dispersed, thereby improving a pressure resistance characteristic against static electricity and providing a contact structure having a durability against a wire bonding force.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A semiconductor device, comprising:
a substrate having a well formed therein;
a diode region located within the well formed in the substrate, the diode region having a plurality of protection diodes;
a pad region overlapped with an upper part of the diode region, the pad region having a pad installed corresponding to an external connection terminal;
an upper metal layer positioned under a lower part of the pad and a lower metal layer positioned under a lower part of the upper metal layer, wherein the diode region includes a first conductive active region and a second conductive active region and wherein the lower metal layer includes:
a first gate pattern having an open region, a unit gate frame and a gate frame shape extended corresponding to the a first conductive active region of the diode region; and
a second pattern of a rectangular shape, wherein the first pattern having the gate frame shape and the second pattern of a rectangular shape together form a combined structure having a web shape, and wherein the second pattern is isolated from the unit gate frame of the first pattern within the open region of the first pattern, corresponding to the second conductive active region of the diode region and wherein the unit gate frame of the first pattern is a frame of a square;
a contact plug unit positioned on the diode region, wherein the contact plug unit connects at least one of a plurality of active regions constituting the diode region to the pad, and wherein the contact plug unit includes a first via contact part and a metal contact part, wherein the first via contact part connects the upper metal layer to the lower metal layer, wherein the metal contact part connects the at least one of the plurality of active regions to the lower metal layer, wherein the first via contact part and the metal contact part are vertically overlapped with each other and wherein the first via contact part and the metal contact part both vertically overlap with the diode region located within the well formed in the substrate; and
a second via contact part electrically connecting the pad region and the upper metal layer, the second via contact part being connected to the pad and positioned under the lower part of the pad, and the second via contact part being positioned between the pad region and the upper metal layer and overlapped with the diode region located within the well formed in the substrate.

2. The device of claim 1, wherein the upper metal layer is connected to the pad and positioned under a lower part of the pad, and the lower metal layer is positioned under a lower part of the upper metal layer; and wherein
the metal contact part electrically connects the lower metal layer to one of the plurality of active regions.

3. The device of claim 2, wherein the first conductive active region of the diode region has substantially the same shape as the shape of the first pattern within the diode region.

4. The device of claim 2, wherein the second conductive active region of the diode region has substantially the same shape as the shape of the second pattern within the diode region.

5. The device of claim 2, wherein the external connection terminal is a pin to transfer signals.

6. The device of claim 2, wherein the protection diode is a p-type diode to discharge a positive static to protect an internal circuit when static electricity of a positive voltage flows into the pad.

7. The device of claim 2, wherein the protection diode is an n-type diode to discharge a negative static to protect an internal circuit when static electricity of a negative voltage flows into the pad.

8. The device of claim 2, wherein the one of the plurality of the active regions is connected to a power line through a power connection metal contact outside the diode region.

9. The device of claim 8, wherein the power line is a line to receive a power supply voltage or ground voltage.

10. The device of claim 2, further comprising a plurality of contact plug units each comprising a first via contact part and a metal contact part, wherein the first via contact part connects an upper metal layer to a lower metal layer, wherein the metal contact part connects at least one of the plurality of active regions constituting a diode region located within a well formed in the substrate to the lower metal layer, the diode region having a plurality of protection diodes and wherein the first via contact part and the metal contact part are vertically overlapped with each other and wherein the first via contact part and the metal contact part both vertically overlap with the diode region located within the well.

11. The device of claim 2, wherein when the first conductive active region of the diode region is a high density n-type diffusion region, and the second conductive active region of the diode region is a high density p-type diffusion region.

12. The device of claim 2, wherein the pad comprises one of an input pad, an output pad or an input/output pad.

13. The device of claim 2, further comprising a tungsten contact part in a lower part of the metal contact part and a metal layer formed by a damascene process in the lower part of the metal contact part.

14. A lower connection structure of a pad in a semiconductor device, the structure comprising:
a protection device, which has a first conductive active region having an extended gate frame shape formed in a well region and wherein the well region is formed in a substrate, and a second conductive active region isolated from the first conductive active region within an open region of the gate frame, wherein the well region includes a well having a plurality of protection diodes formed therein;
a first metal layer, which has a first pattern having an open region, a unit gate frame and an extended gate frame shape on the first conductive active region, and a second pattern of a rectangular shape on the second conductive active region, wherein the first pattern having the gate frame shape and the second pattern of a rectangular shape together form a combined structure having a web shape as one layer, and wherein the second pattern is isolated from the unit gate frame of the first pattern within the open region of the first pattern and wherein the unit gate frame of the first pattern is a frame of a square;

a second metal layer formed on the first metal layer;

a pad, which covers the protection device from an upper side, is formed on the second metal layer and is connected to an external connection pin; and a contact unit, which has a second via contact part which electrically connects the pad to the second metal layer, a first via contact part which electrically connects the second metal layer to the second pattern of a rectangular shape of the first metal layer on a vertically upper part of the second conductive active region, and a metal contact part vertically overlapped with the first via contact part, wherein the metal contact part and the first via contact part are both vertically overlapped with the well region having a plurality of protection diodes formed therein, and wherein the metal contact part electrically connects the second pattern of a rectangular shape of the first metal layer and the second conductive active region.

15. The structure of claim 14, wherein a metal contact connected to the first pattern of the first metal layer is formed on the first conductive active region, and a via contact is formed outside a region where the protection device is positioned.

16. The structure of claim 14, wherein the external connection pin transfers signals or power source voltage.

17. The structure of claim 15, wherein the protection device is a p-type diode, and is adapted to discharge a positive static to a power line when the static electricity of a positive voltage flows to the pad, so as to protect an internal circuit.

18. The structure of claim 15, wherein the protection device is an n-type diode, and is adapted to discharge a negative static to a ground when the static electricity of negative voltage flows to the pad, so as to protect the internal circuit.

19. The structure of claim 17, further comprising a plurality of contact plug units each comprising a first via contact part and a metal contact part, wherein the first via contact part connects an upper metal layer to a lower metal layer, wherein the metal contact part electrically connects a second pattern of a rectangular shape of the first metal layer to a second conductive active region and wherein the first via contact part and the metal contact part are vertically overlapped with each other and wherein the first via contact part and the metal contact part both vertically overlap with the diode region located within the well.

20. The structure of claim 16, wherein when the first conductive active region is a high density n-type diffusion region, the second conductive active region is a high density p-type diffusion region.

21. The structure of claim 16, wherein the pad comprises one of an input pad, an output pad or an input/output pad.

22. The structure of claim 14, further comprising an active region in the diode region connected to a metal zeroth layer MO through a tungsten contact part formed on a lower part of the metal zeroth layer MO, wherein the metal zeroth layer MO is formed by a damascene process on the lower part of the metal contact part of the contact plug unit, and wherein the metal zeroth layer MO is connected to the lower metal layer through the metal contact part.

23. An electrical connection structure between a protection device and a bonding pad for use in a semiconductor integrated circuit, comprising a bonding pad connected to an external connection terminal and wherein the bonding pad is vertically linearly connected to a diode region of the protection device through a contact plug unit positioned on the diode region located within a well, wherein an insulation layer is provided between a lower part of the bonding pad and the protection device to protect an internal circuit device from static electricity, wherein the contact plug unit comprises:

a first via contact part which electrically connects an upper metal layer and a lower metal layer, the upper metal layer is connected to the bonding pad and positioned under a lower part of the bonding pad, and the lower metal layer is positioned under a lower part of the upper metal layer; and a metal contact part, which electrically connects the lower metal layer and the diode region and which is positioned overlapping a vertically lower part of the first via contact part, and wherein the metal contact part and the first via contact part both overlap the diode region located within the well;

a second via contact part electrically connecting the bonding pad and the upper metal layer, the second via contact part being connected to the bonding pad and positioned under a lower part of the bonding pad, and the second via contact part being positioned between the bonding pad and the upper metal layer and overlapping with the diode region located within the well, and wherein the lower metal layer includes:

a first pattern having an open region, a unit gate frame and a gate frame shape extended on a first conductive active region of the diode region; and a second pattern of a rectangular shape on a second conductive action region of the diode region, wherein the combined structure of the first pattern having the gate frame shape and the second pattern of a rectangular shape together forms a web structure, and wherein the second pattern of a rectangular shape is isolated from the unit gate frame of the first pattern within the open region of the first pattern and wherein the unit gate frame of the first pattern is a frame of a square.

24. The structure of claim 23, wherein the external connection terminal is a pin to transfer signals.

25. The structure of claim 23, wherein the protection device comprises a p-type diode adapted to discharge a positive static to an output power line when the static electricity of a positive voltage flows to the bonding pad, so as to protect the internal circuit device.

26. The structure of claim 23, wherein the active region comprises one of a high-density p-type diffusion region or an n-type diffusion region.

27. The structure of claim 23, further comprising an active region in the diode region connected to a metal zeroth layer MO through a tungsten contact part formed on a lower part of the metal zeroth layer MO, wherein the metal zeroth layer MO is formed by a damascene process on the lower part of the metal contact part of the contact plug unit, and wherein the metal zeroth layer MO is connected to the lower metal layer through the metal contact part.

* * * * *